United States Patent
Smith et al.

(10) Patent No.: US 9,263,625 B2
(45) Date of Patent: Feb. 16, 2016

(54) SOLAR CELL EMITTER REGION FABRICATION USING ION IMPLANTATION

(71) Applicants: David D. Smith, Campbell, CA (US); Timothy Weidman, Sunnyvale, CA (US); Staffan Westerberg, Sunnyvale, CA (US)

(72) Inventors: David D. Smith, Campbell, CA (US); Timothy Weidman, Sunnyvale, CA (US); Staffan Westerberg, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 27 days.

(21) Appl. No.: 14/320,438

(22) Filed: Jun. 30, 2014

(65) Prior Publication Data

US 2015/0380599 A1    Dec. 31, 2015

(51) Int. Cl.
*H01L 21/00* (2006.01)
*H01L 31/18* (2006.01)
*H01L 31/0368* (2006.01)
*H01L 31/0224* (2006.01)

(52) U.S. Cl.
CPC .... *H01L 31/1864* (2013.01); *H01L 31/022441* (2013.01); *H01L 31/03682* (2013.01)

(58) Field of Classification Search
None
See application file for complete search history.

(56) References Cited

U.S. PATENT DOCUMENTS

| | | | |
|---|---|---|---|
| 2,695,852 A | 11/1954 | Sparks | |
| 3,736,425 A | 5/1973 | Chernow | |
| 3,790,412 A | 2/1974 | Moline | |
| 4,086,102 A | 4/1978 | King | |
| 4,381,956 A | 5/1983 | Lane | |
| 4,448,797 A | 5/1984 | Burnham | |
| 4,448,865 A | 5/1984 | Bohlen et al. | |
| 4,557,037 A | 12/1985 | Hanoka et al. | |
| 5,907,766 A | 5/1999 | Swanson et al. | |
| 6,087,274 A | 7/2000 | Tonucci et al. | |
| 6,335,534 B1 | 1/2002 | Suguro et al. | |
| 6,417,078 B1 | 7/2002 | Dolan et al. | |
| 6,614,033 B2 | 9/2003 | Suguro et al. | |
| 7,094,612 B2 | 8/2006 | Shibata et al. | |
| 7,179,569 B2 | 2/2007 | Suguro et al. | |
| 7,208,381 B2 | 4/2007 | Lee | |

(Continued)

OTHER PUBLICATIONS

Lu, Nicky C., et al., "Modeling and Optimization of Monolithic Polycrystalline Silicon Resistors", IEEE Transactions on Electron Devices, vol. ED-28, No. 7, Jul. 1981, pp. 818-830.

(Continued)

*Primary Examiner* — Jack Chen
(74) *Attorney, Agent, or Firm* — Blakely Sokoloff Taylor Zafman LLP

(57) ABSTRACT

Methods of fabricating solar cell emitter regions using ion implantation, and resulting solar cells, are described. In an example, a back contact solar cell includes a crystalline silicon substrate having a light-receiving surface and a back surface. A first polycrystalline silicon emitter region is disposed above the crystalline silicon substrate. The first polycrystalline silicon emitter region is doped with dopant impurity species of a first conductivity type and further includes ancillary impurity species different from the dopant impurity species of the first conductivity type. A second polycrystalline silicon emitter region is disposed above the crystalline silicon substrate and is adjacent to but separated from the first polycrystalline silicon emitter region. The second polycrystalline silicon emitter region is doped with dopant impurity species of a second, opposite, conductivity type. First and second conductive contact structures are electrically connected to the first and second polycrystalline silicon emitter regions, respectively.

16 Claims, 8 Drawing Sheets

(56) References Cited

U.S. PATENT DOCUMENTS

| | | | |
|---|---|---|---|
| 7,459,246 | B2 | 12/2008 | Suguro et al. |
| 7,531,216 | B2 | 5/2009 | Brody |
| 7,638,438 | B2 | 12/2009 | Eldershaw |
| 7,727,866 | B2 | 6/2010 | Bateman et al. |
| 7,745,073 | B2 | 6/2010 | Suguro et al. |
| 7,816,239 | B2 | 10/2010 | Blake et al. |
| 7,820,460 | B2 | 10/2010 | Sullivan et al. |
| 7,888,249 | B2 | 2/2011 | Bateman et al. |
| 8,222,053 | B2 | 7/2012 | Sullivan et al. |
| 8,470,616 | B2 | 6/2013 | Sullivan et al. |
| 2004/0112426 | A1 | 6/2004 | Hagino |
| 2008/0072953 | A1 | 3/2008 | Stephens et al. |
| 2009/0068783 | A1 | 3/2009 | Borden |
| 2009/0227061 | A1 | 9/2009 | Bateman et al. |
| 2010/0147369 | A1 | 6/2010 | Sung |
| 2010/0308382 | A1 | 12/2010 | Johnson et al. |
| 2012/0266951 | A1 | 10/2012 | Li et al. |
| 2012/0273040 | A1 | 11/2012 | Kim et al. |
| 2013/0008494 | A1 | 1/2013 | Bateman et al. |
| 2014/0154834 | A1 | 6/2014 | Bateman et al. |
| 2015/0162483 | A1* | 6/2015 | Weidman ............ H01L 31/182 136/256 |
| 2015/0162484 | A1 | 6/2015 | Weidman |

OTHER PUBLICATIONS

Meier, D. L., et al., "Aluminum alloy back p-n junction dendritic web silicon solar cell", Elsevier, Solar Energy Materials & Solar Cells 65 (2001), pp. 621-627.

Nishihashi, T., et al., "Ion-graphy implanter with stencil mask", Journal of Vacuum Science & Technology B20, 914 (2002); doi: 10.1116/1.1475982, 5 pgs.

Rusop, M., et al., "Photoelectrical properties of pulsed laser deposited boron doped p-carbon/n-silicon and phosphorus doped n-carbon/p-silicon heterojunction solar cells", Elsevier, Solar Energy 78 (2005) pp. 406-415.

Tonari, Kazuhiko, et al., "Stencil mask Ion Implantation Technology for realistic approach to wafer process", AIP Conference Proceedings 866, 401 (2006); doi; 10.1063/1.2401541, 5 pgs.

Wang, Qi, et al., "Combinatorial synthesis of solid state electronic materials for renewable energy applications", Elsevier, Applied Surface Science 189 (2002), pp. 271-276.

Weidman, Timothy, U.S. Appl. No. 14/100,540, filed Dec. 9, 2013, 43 pgs.

International Search Report and Written Opinion from PCT/US2015/037523 mailed Oct. 7, 2015, 15 pgs.

* cited by examiner

US 9,263,625 B2

SOLAR CELL EMITTER REGION FABRICATION USING ION IMPLANTATION

TECHNICAL FIELD

Embodiments of the present disclosure are in the field of renewable energy and, in particular, methods of fabricating solar cell emitter regions using ion implantation, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
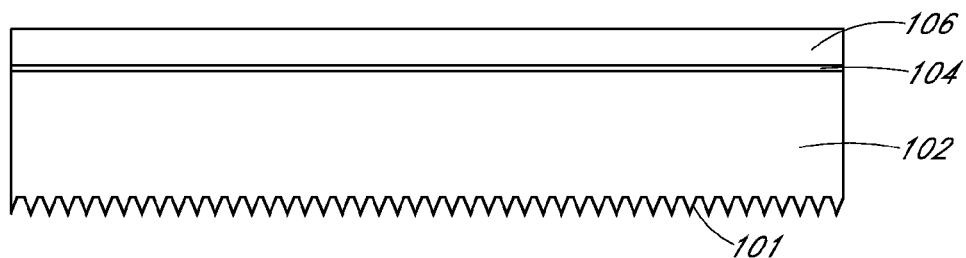
FIGS. 1A-1G illustrate cross-sectional views of various stages in the fabrication of a solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions using ion implantation, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating alternating N-type and P-type emitter regions of a solar cell involves forming a silicon layer above a substrate. The method also involves implanting dopant impurity species of a first conductivity type in the silicon layer to form first implanted regions and resulting in non-implanted regions of the silicon layer. The method also involves implanting ancillary impurity species into the first implanted regions of the silicon layer, the ancillary impurity species different from the dopant impurity species of the first conductivity type. The method also involves implanting dopant impurity species of a second, opposite, conductivity type in portions of the non-implanted regions of the silicon layer to form second implanted regions and resulting in remaining non-implanted regions of the silicon layer. The method also involves removing the remaining non-implanted regions of the silicon layer with a selective etch process preserving at least a portion of the first implanted regions and preserving the second implanted regions of the silicon layer. The method also involves annealing the first implanted regions and the second implanted regions of the silicon layer to form doped polycrystalline silicon emitter regions.

In another embodiment, a method of fabricating alternating N-type and P-type emitter regions of a solar cell involves forming a silicon layer above a substrate. The method also involves implanting dopant impurity species of a first conductivity type in the silicon layer to form first implanted regions and resulting in non-implanted regions of the silicon layer. The method also involves modifying a shallow surface of the first implanted regions of the silicon layer. The modifying is performed by flowing a precursor for an ancillary impurity species different from the dopant impurity species of the first conductivity type. The method also involves implanting dopant impurity species of a second, opposite, conductivity type in portions of the non-implanted regions of the silicon layer to form second implanted regions and resulting in remaining non-implanted regions of the silicon layer. The method also involves removing the remaining non-implanted regions of the silicon layer with a selective etch process preserving at least a portion of the first implanted regions and preserving the second implanted regions of the silicon layer. The method also involves annealing the first implanted regions and the second implanted regions of the silicon layer to form doped polycrystalline silicon emitter regions.

Also disclosed herein are solar cells. In one embodiment, a back contact solar cell includes a crystalline silicon substrate having a light-receiving surface and a back surface. A first polycrystalline silicon emitter region is disposed above the crystalline silicon substrate. The first polycrystalline silicon emitter region is doped with dopant impurity species of a first conductivity type and further includes ancillary impurity species different from the dopant impurity species of the first conductivity type. A second polycrystalline silicon emitter region is disposed above the crystalline silicon substrate and is adjacent to but separated from the first polycrystalline silicon emitter region. The second polycrystalline silicon emitter region is doped with dopant impurity species of a second, opposite, conductivity type. First and second conductive contact structures are electrically connected to the first and second polycrystalline silicon emitter regions, respectively.

Also disclosed herein are apparatuses for fabricating solar cells. In one embodiment, an in-line process apparatus for fabricating emitter regions of a solar cell includes a first station configured to implant dopant impurity atoms of a first conductivity type through a first shadow mask and into first regions of a material layer disposed above a substrate. The in-line process apparatus also includes a second station configured to implant ancillary impurity species through a second shadow mask and into the first regions of the material layer. The in-line process apparatus also includes a third station configured to implant dopant impurity atoms of a second, different, conductivity type through a third shadow mask and into second, different, regions of the material layer. In one such embodiment, the first station is configured to implant phosphorous or arsenic atoms or ions, the third station is configured to implant boron atoms or ions, and the second station is configured to implant a species such as, but not limited to, nitrogen atoms or ions, carbon atoms or ions, or oxygen atoms or ions.

One or more embodiments described herein provides a simplified process flow for fabricating high efficiency, all back-contact solar cell devices involving the use of ion implant technology for generating one or both of N+ (e.g., typically phosphorous or arsenic doped) and P+ (e.g., typically boron doped) polysilicon emitter layers. In one embodiment, a fabrication approach involves the use of ion implantation to introduce atoms of the required dopant type as well as ancillary atoms into an emitter layer to induce sufficient changes in the wet etch properties of the emitter layer so as to permit its use as a mask during selective wet etch removal of all non-implanted regions of the emitter layer. One or more embodiments are directed to hardware and corresponding processes for integrated patterned ion implant and surface modification for high efficiency solar cell fabrication. One or more embodiments provide an effective, process operation saving approach for generating (and isolating) separate N- and P-doped polycrystalline silicon (polySi) finger emitters covering the backside of a high efficiency solar cell using patterned ion implant technology.

To provide context, currently, interdigitated back contact (IBC) processing schemes can be implemented to effectively generate patterned diffusion regions covered by doped oxide layers. Such structures are patterned to generate texture etch resistant masks through which trench isolating N- and P-doped emitters are formed at the same time as front side texturizing is performed. While the concept of employing patterned ion implant to replace diffusion from patterned oxide layers may seem straightforward, unless combined with an approach providing self-aligned etch selectivity, such an approach may not be viable for fabricating a high efficiency solar cell structure having doped polycrystalline silicon emitter regions. This may particularly be the case for approaches using phosphorous implants.

Addressing one or more of the above issues, in accordance with an embodiment of the present disclosure, a one-dimensional finger structure for a solar cell ultimately having doped polycrystalline silicon emitter regions is formed by performing patterned ion implantation of phosphorous (or arsenic) and boron slightly offset from one another and leaving a non-implant gap in-between. Following the phosphorous (or arsenic) implant, a second self-aligned (e.g., through a same mask pattern) shallow implant of nitrogen, oxygen, or carbon ions (or positively charged molecular clusters containing these elements) is performed. The implantation of such ancillary (or "chaser") species in the same regions as the phosphorous (or arsenic) is performed in order to modify the surface of the implanted region and increase the etch resistance to alkaline texturing baths. Since boron implantation alone increases etch resistance substantially, a combination of first regions (e.g., implanted lines) of a polySi film having a phosphorous+shallow chaser dopant profile interdigitated with second regions (e.g., implanted lines) of the polySi film having a boron dopant profile can be subjected to a well established texture etch process flow. Such an etch process can simultaneously remove regions of non-implanted polySi (e.g., between implanted fingers) while texturing the front (sun-facing) side of the wafer. Furthermore, a new hardware platform is described that can perform all three patterned and aligned implant operations in a single pass. The above and other approaches and hardware platforms are described in greater detail below.

In an exemplary process flow using implant induced etch selectivity for self-aligned trench formation, FIGS. 1A-1G illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A-1G, in accordance with an embodiment of the present disclosure.

Figure 2:
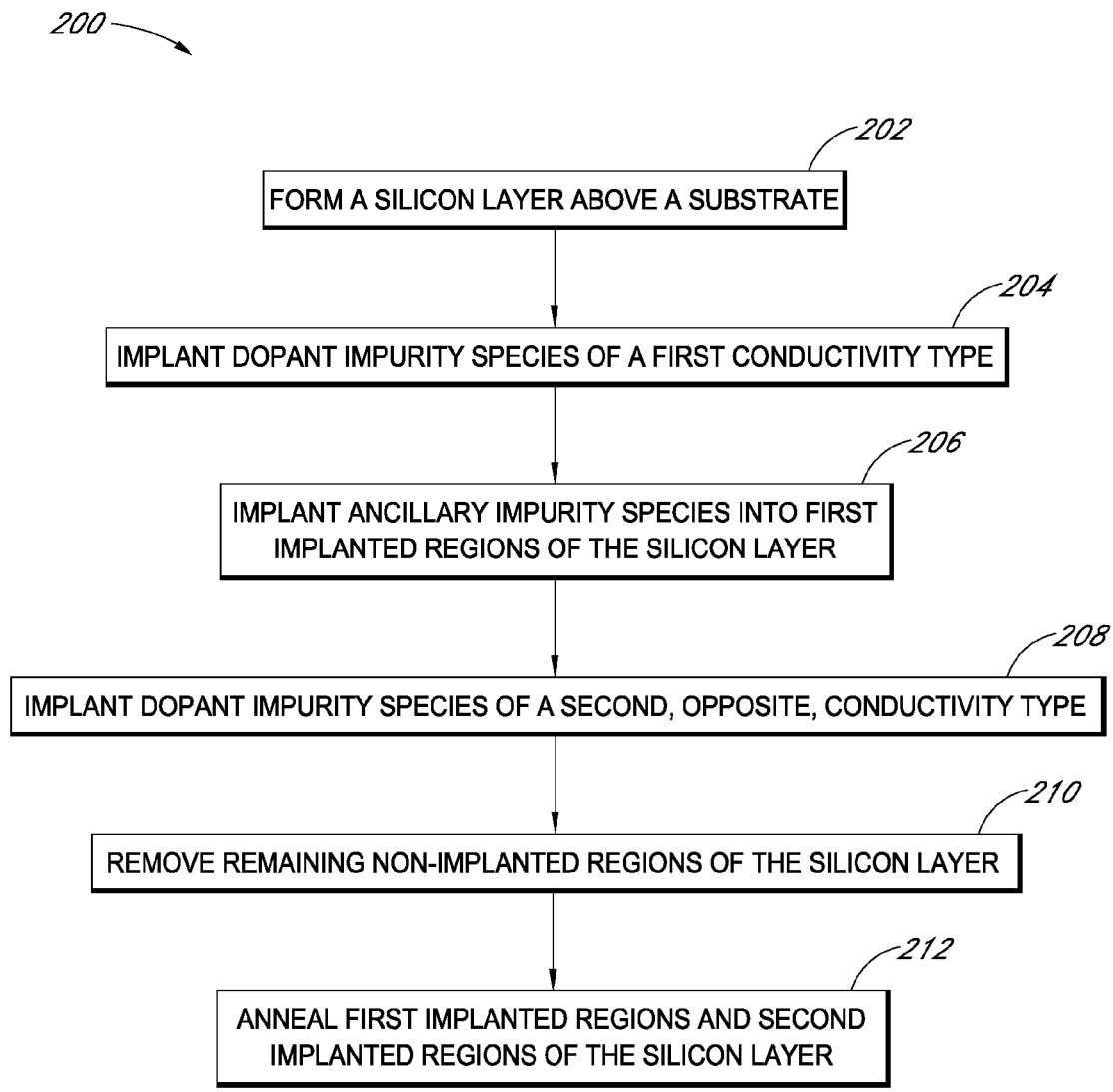
FIG. 2 is a flowchart listing operations in a method of fabricating a solar cell as corresponding to FIGS. 1A-1G, in accordance with an embodiment of the present disclosure.

Referring to FIG. 1A and corresponding operation 202 of flowchart 200, a method of fabricating alternating N-type and P-type emitter regions of a solar cell involves forming a silicon layer 106 on a thin oxide layer 104 disposed on a substrate 102.

In an embodiment, the substrate 102 is a monocrystalline silicon substrate, such as a bulk single crystalline N-type doped silicon substrate. It is to be understood, however, that substrate 102 may be a layer, such as a multi-crystalline silicon layer, disposed on a global solar cell substrate. Referring again to FIG. 1A, in an embodiment, as shown, a light receiving surface 101 of the substrate 102 is texturized, as described in greater detail below. In an embodiment, the thin oxide layer is a tunnel dielectric silicon oxide layer having a thickness of approximately 2 nanometers or less.

In an embodiment, the silicon layer 106 is an amorphous silicon layer. In one such embodiment, the amorphous silicon layer is formed using low pressure chemical vapor deposition (LPCVD) or plasma enhanced chemical vapor deposition (PECVD). However, in an alternative embodiment, a polycrystalline silicon layer is used instead of amorphous silicon.

Figure 1B:
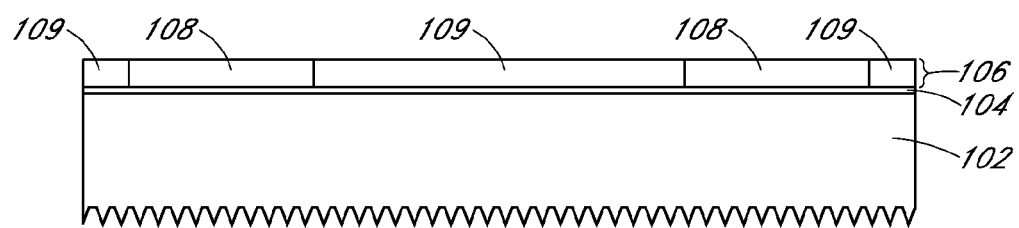

Referring to FIG. 1B and corresponding operation 204 of flowchart 200, dopant impurity species of a first conductivity type are implanted in the silicon layer 106 to form first implanted regions 108 and resulting in non-implanted regions 109 of the silicon layer (i.e., remaining portions of silicon layer 106 that have not been implanted at this stage in the process).

In an embodiment, the implanting is performed by using ion beam implantation or plasma immersion implantation. In one embodiment, this first implanting provides N+ dopant atoms for silicon (e.g., phosphorous or arsenic atoms). In a specific such embodiment, implanting the phosphorous or arsenic atoms or ions involves implanting to form a concentration of phosphorous or arsenic atoms in the silicon layer 106 approximately in the range of 1E19-1E20 atoms/cm$^3$.

Figure 4:
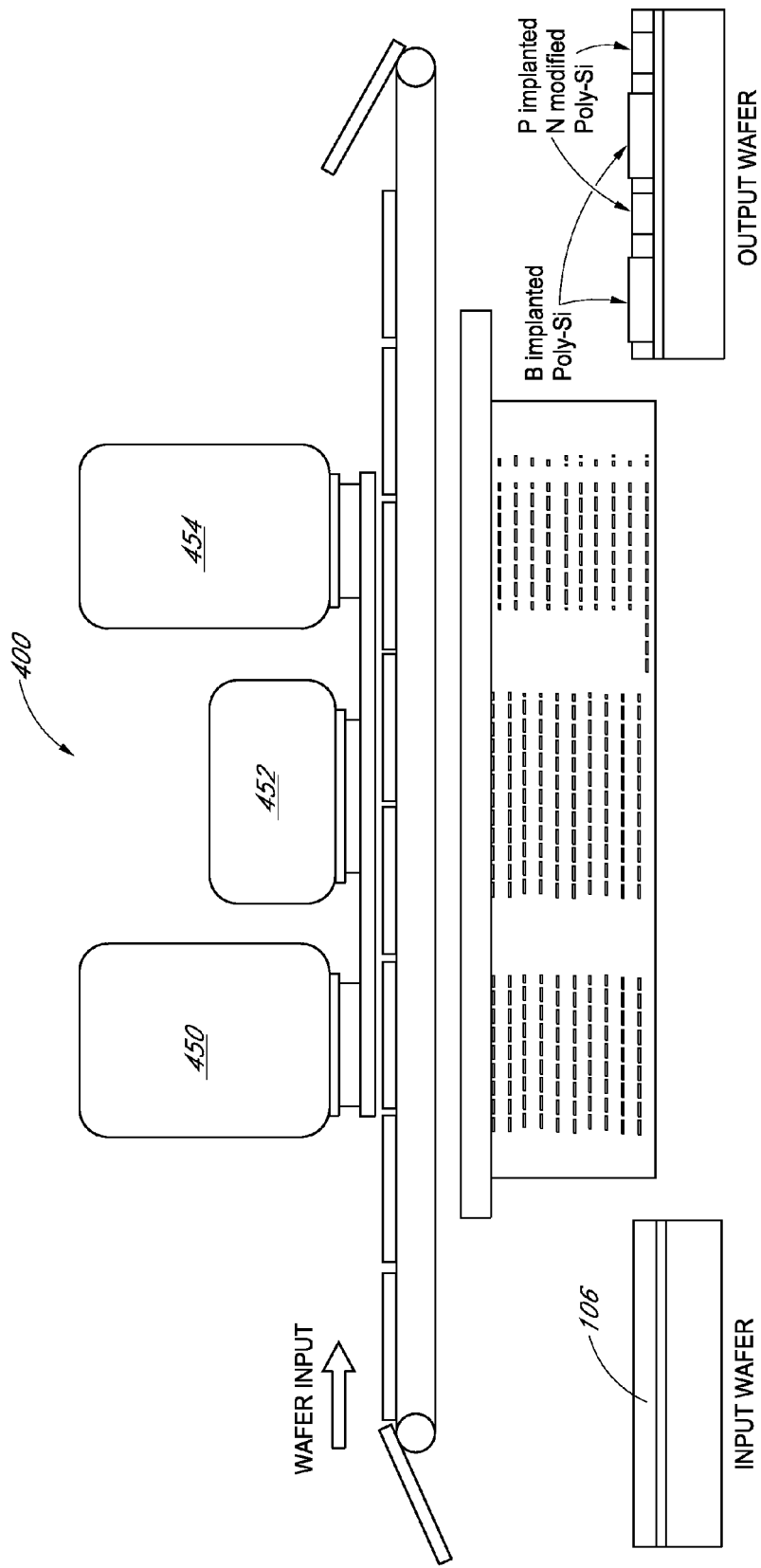
FIG. 4 schematically illustrates a cross-sectional view of an inline platform for patterned implant involving a traveling wafer and stationary shadow mask, in accordance with an embodiment of the present disclosure.

Referring again to operation 204, in an embodiment, the implanting is performed through a first shadow mask, an example of which is described in association with FIG. 4. In one such embodiment, the dopant impurity species of the first conductivity type are implanted through a first shadow mask having a first slit pattern, examples of which are described in association with FIGS. 7A and 7B. In an embodiment, the first shadow mask is a graphite shadow mask positioned off of, but in close proximity to, the silicon layer 106.

Figure 1C:
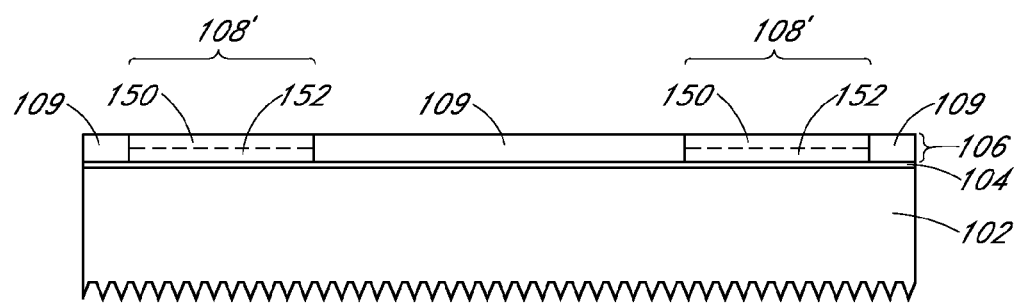

Referring next to FIG. 1C and corresponding operation 206 of flowchart 200, ancillary impurity species are implanted into the first implanted regions 108 of the silicon layer 106. The ancillary impurity species are different from the dopant impurity species of the first conductivity type. Additionally, in an embodiment, the corresponding region of the ancillary impurity species are implanted to have a depth in the silicon layer 106 less than the depth of the respective original first implanted region 108. As such, modified first implanted regions 108' are formed and, in one embodiment, have lower portions 152 that are phosphorous (or arsenic)-only regions 152 and have upper portions 150 that are regions of phosphorous (or arsenic) along with the ancillary impurity species, as is depicted in FIG. 1C.

In an embodiment, the ancillary impurity species implanted into the first implanted regions are species such as, but not limited to, nitrogen atoms or ions, carbon atoms or ions, or oxygen atoms or ions. It is to be appreciated that the term "ions" may include molecular ions containing one or more atoms of the dopant species bonded to additional hydrogen atoms. In one embodiment, the ancillary impurity species is nitrogen and is provided by implantation using $N_2$ or $NH_3$. In one embodiment, the ancillary impurity species is carbon and is provided by implantation using $CH_4$ or a hydrocarbon such as acetylene or, possibly, methylsilane. In one embodiment, the ancillary impurity species is oxygen and is provided by implantation using $N_2O$ or $O_2$.

In an embodiment, the implanting is performed by using ion beam implantation or plasma immersion implantation. In one embodiment, this second implanting ultimately provides nitrogen atoms, carbon atoms, or oxygen atoms in an upper portion of the N+ regions of the silicon layer 106. In a specific such embodiment, implanting the second implanting form a concentration of nitrogen, carbon or oxygen atoms in the silicon layer 106 approximately in the range of 1E19-1E21 atoms/cm$^3$. In one embodiment, the distribution of the ancillary impurity species is localized predominately within the first 1000 Angstroms below the surface of the silicon layer 106.

Referring again to operation 206, in an embodiment, the implanting is performed through a second shadow mask, an example of which is described in association with FIG. 4. In one such embodiment, the ancillary impurity species are implanted through a second shadow mask having the first slit pattern. The first slit pattern may be the same as or slightly modified from the above first slit pattern described in association with operation 204, as is described greater detail below. In an embodiment, the second shadow mask is a graphite shadow mask positioned off of, but in close proximity to, the silicon layer 106.

Figure 3:
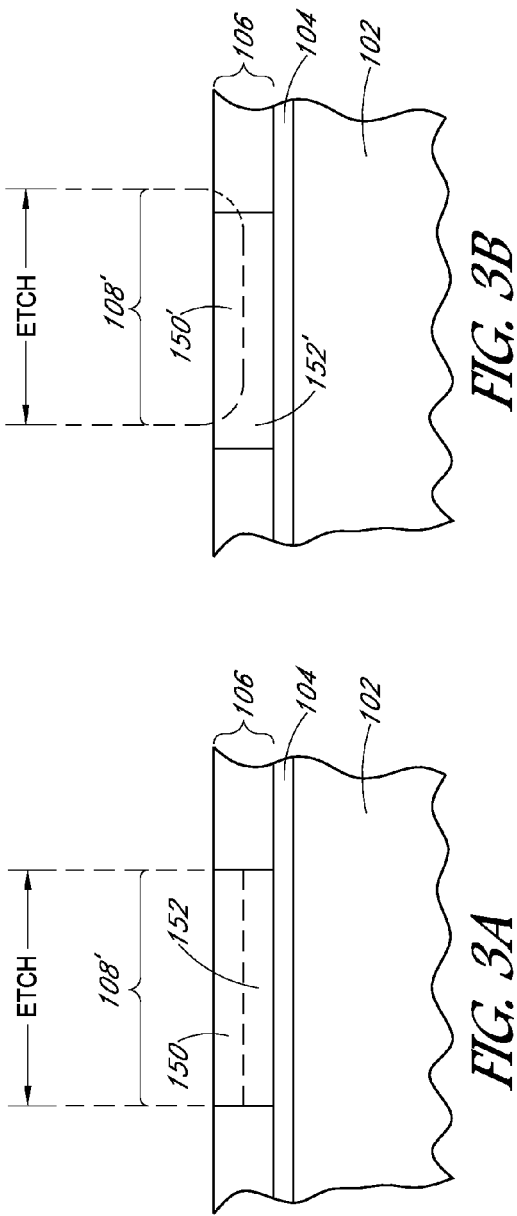
FIG. 3A illustrates a cross-sectional view of a modified first implanted region formed using an aligned slit pattern of same dimension, in accordance with an embodiment of the present disclosure.
FIG. 3B illustrates a cross-sectional view of a modified first implanted region formed using a misaligned slit pattern of same dimension, in accordance with an embodiment of the present disclosure.
FIG. 3C illustrates a cross-sectional view of a modified first implanted region formed using a slit pattern of smaller (e.g., narrower) dimension, in accordance with an embodiment of the present disclosure.

As mentioned above, implanting ancillary impurity species into the first implanted regions 108 can, in an embodiment, involve implanting through a second shadow mask having the first slit pattern (i.e., the slit pattern used to form original regions 108). In a first embodiment, the second shadow mask has the same slit pattern as the first slit pattern, and the dimensions of the slits are the same as those of the first shadow mask. As an example, FIG. 3A illustrates a cross-sectional view of a modified first implanted region 108' formed using an aligned slit pattern of same dimension. The region of ancillary atoms 150 is aligned with the N+ region 152 in the silicon layer 106.

However, FIG. 3B illustrates a cross-sectional view of a modified first implanted region 108' formed using a misaligned slit pattern of same dimension. The region of ancillary impurity species 150' is misaligned with the N+ region 152' in the silicon layer 106. That is, a portion of the region of ancillary impurity species 150' is formed within the N+ region 152', but a portion of the region of the ancillary impurity species 150' is formed outside of the N+ region 152'. It may be the case that is preferable to have the region of the ancillary impurity species formed entirely with the N+ region.

Accordingly, in one embodiment, FIG. 3C illustrates a cross-sectional view of a modified first implanted region 108' formed using a slit pattern of smaller (e.g., narrower) dimension. The region of ancillary impurity species 150" is narrower than and is formed entirely within the N+ region 152". In one such embodiment, using a narrower dimension for the slit in the second mask allows for misalignment tolerance without risk of having ancillary impurity species implanted outside of the N+ region.

Figure 1D:
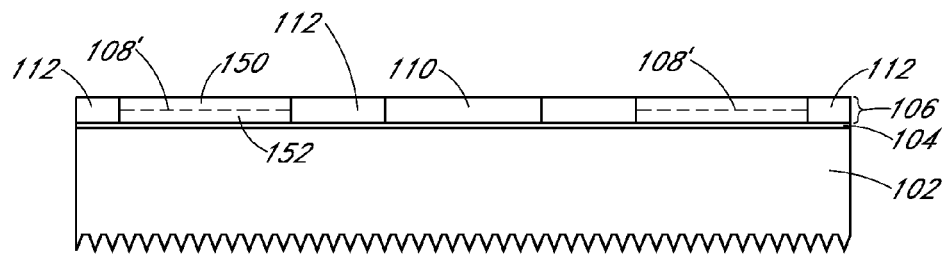

Referring to FIG. 1D and corresponding operation 208 of flowchart 200, dopant impurity species of a second conductivity type are implanted in the silicon layer 106 to form second implanted regions 110 and resulting in non-implanted regions 112 of the silicon layer (i.e., remaining portions of the silicon layer 106 that were not significantly implanted during any of the above described implantation processes).

As in the case for the first and second implantation processes, in an embodiment, the implanting is performed by using ion beam implantation or plasma immersion implantation. In one embodiment, this third implanting provides P+ dopant atoms for silicon (e.g., boron atoms). In a specific such embodiment, implanting the boron atoms or ions involves implanting to form a concentration of boron atoms in the silicon layer 106 approximately in the range of 1E19-1E20 atoms/cm$^3$.

Referring again to operation 208, in an embodiment, the implanting is performed through a third shadow mask, an example of which is described in association with FIG. 4. In one such embodiment, the dopant impurity species of the second conductivity type are implanted through a third shadow mask having a second slit pattern different from the first slit pattern, examples of which are described in association with FIGS. 7A and 7B. In one such embodiment, the first slit pattern and the second slit pattern together form a one-dimensional interdigitated finger pattern. As in the case of the first and second shadow masks, in an embodiment, the third shadow mask is a graphite shadow mask positioned off of, but in close proximity to, the silicon layer 106.

Figure 1E:
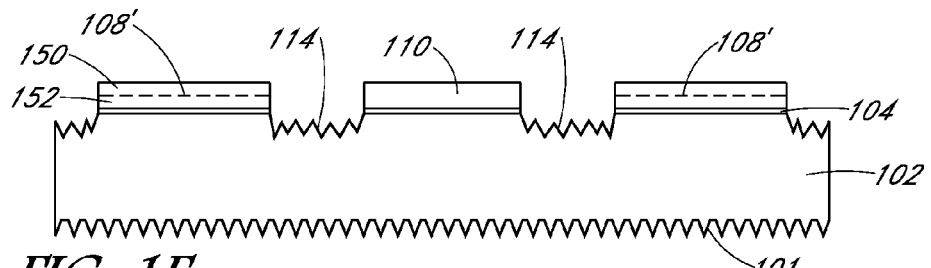

Referring to FIG. 1E and corresponding operation 210 of flowchart 200, the remaining non-implanted regions 112 of the silicon layer 106 are removed, for example with a selective etch process, preserving the modified first implanted regions 108' and the second implanted regions 110 of the silicon layer 106.

In embodiment, the ancillary impurity species provided in operation 206 to form the modified first implanted regions 108' inhibit the etching (e.g., slow the etch rate of) the modified first implanted regions 108'. In one such embodiment, the ancillary implanted species are employed to affect etch selectivity and are intentionally implanted at lower energies to achieve shallower distributions (e.g., near the surface). Furthermore, the amount of such ancillary species may be reduced or even completely eliminated in subsequent wet and/or dry etching/cleaning operations, particularly where the sole driving factor for including them is to inhibit etching of the N+ regions at operation 210.

Referring again to FIGS. 3A and 3C, in an embodiment, the corresponding region of the ancillary impurity species is entirely within the respective one of the original first implanted region 108. In a particular embodiment, referring only to FIG. 3C, the corresponding region of the ancillary impurity species has a width less than the width of the respective first implanted regions. In either case, in an embodiment, the resulting etch width is determined by the width of the region 150 or 150" of the ancillary impurity species, as is depicted in FIGS. 3A and 3C. In the case of FIG. 3C, then, in one embodiment, removing the remaining non-implanted regions of the silicon layer 106 further includes removing portions of the modified first implanted region 108' that does not include the corresponding region 150" of the ancillary impurity species. For comparison purposes, referring to FIG. 3B, such a resulting etch profile would include a region having ancillary impurity species formed outside of the N+ region. It is for this reason that use of an ancillary impurity species implantation mask having narrower dimensions of slits may be considered for the chaser implantation described above.

In an embodiment, the remaining non-implanted regions 112 of the silicon layer 106 are removed with a hydroxide-based wet etchant that further removes exposed portions of the thin oxide layer 104 and forms trenches 114 into the substrate 102. The trenches may be formed to provide texturized portions of the substrate 102 as trench bottoms. In an embodiment, since the positioning of trenches 114 is determined by the first implanted regions 108' and the second implanted regions 110 of the silicon layer 106, the trenches 114 are formed as self-aligned between the first implanted regions 108' and the second implanted regions 110 of the silicon layer 106, as is depicted in FIG. 1E. In one embodiment, the hydroxide-based wet etchant treatment is followed by a hydrofluoric acid/ozone (HF/O$_3$) wet clean treatment.

It is to be appreciated that the timing of the texturizing of light receiving surface 101 and self-aligned trench 114 formation may vary. For example, in one embodiment, the texturizing of light receiving surface 101 is performed in a separate process preceding the formation/texturizing of trenches 114, as is represented in FIGS. 1A-1G. However, in another embodiment, the texturizing of light receiving surface 101 is performed in a same process as the formation/texturizing of trenches 114. Furthermore, the timing of formation/texturizing of trenches 114 may vary relative to an anneal process used to crystallize the first implanted regions 108' and the second implanted regions 110. For example, in one embodiment, formation/texturizing of trenches 114 is performed in the process used to remove the remaining non-implanted regions 112 of the silicon layer 106, as is depicted in FIG. 1E.

However, in another embodiment, formation/texturizing of trenches 114 is performed following removal of the remaining non-implanted regions 112 of the silicon layer 106 and subsequent anneal process. In an embodiment, a texturized surface (whether in trench 114 or at surface 101) may be one which has a regular or an irregular shaped surface for scattering incoming light, decreasing the amount of light reflected off of the light-receiving and/or exposed surfaces of the solar cell.

Figure 1F:
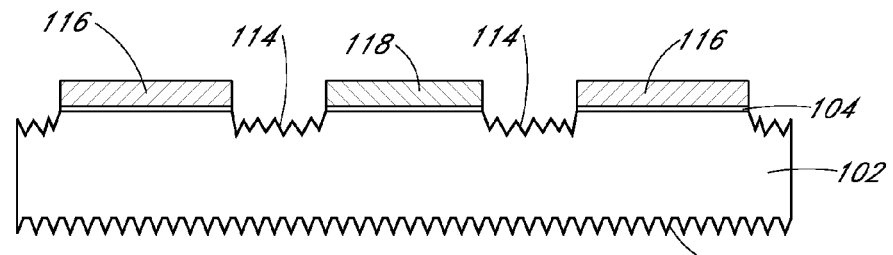

Referring to FIG. 1F and corresponding operation 212 of flowchart 200, the first implanted regions 108' and the second implanted regions 110 of the silicon layer 106 are annealed to form doped polycrystalline silicon emitter regions 116 and 118, respectively. In an embodiment, the annealing is performed at a temperature approximately in the range of 850-1100 degrees Celsius for a duration approximately in the range of 1-100 minutes. In an embodiment, a light phosphorous dopant drive is performed during the heating or annealing. Additional embodiments can include formation of a passivation or anti-reflective coating layer 120 on the light-receiving surface 101, an example of which is shown in FIG. 1G, described below.

It is to be appreciated that, while it may be generally most advantageous to complete the etch (i.e. removal) of non-implanted areas of silicon layer 106 prior to performing a high temperature anneal and activation process, as is described above, certain implant conditions may result in intrinsically higher reactivity in the texturizing etch (e.g., as relative to non-implanted regions). In such a case, a high temperature anneal can be performed prior to trench etch.

Figure 1G:
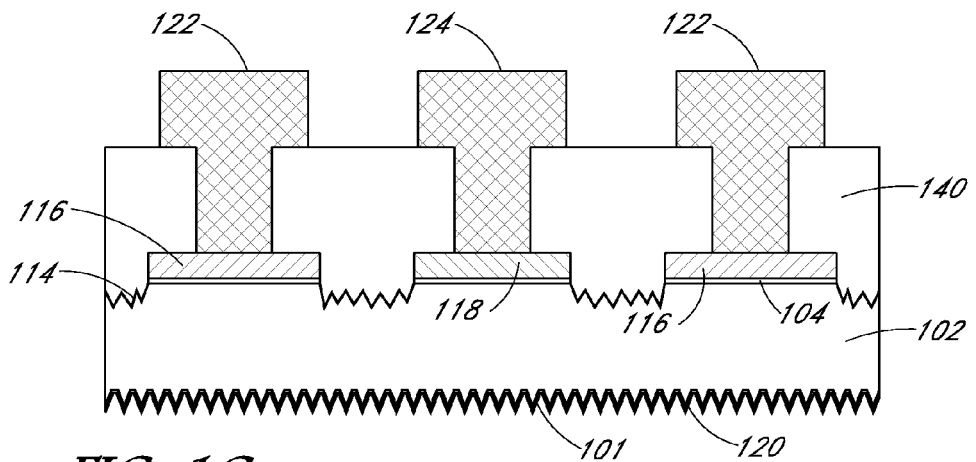

Referring to FIG. 1G, conductive contacts 122 and 124 are fabricated to contact the first 116 and second 118 doped polycrystalline silicon emitter regions, respectively. In an embodiment, the contacts are fabricated by first depositing and patterning an insulating layer 140 to have openings and then forming one or more conductive layers in the openings. In an embodiment, the conductive contacts 122 and 124 include metal and are formed by a deposition, lithographic, and etch approach or, alternatively, a printing process.

Referring again to FIG. 1G, then, in an exemplary embodiment, a back contact solar cell includes a crystalline silicon substrate 102 having a light-receiving surface 101 and a back surface. A first polycrystalline silicon emitter region 116 is disposed above the crystalline silicon substrate 102. The first polycrystalline silicon emitter region 116 is doped with dopant impurity species of a first conductivity type (e.g., phosphorous or arsenic atoms) and further includes ancillary impurity species (e.g., nitrogen atoms, carbon atoms, and/or oxygen atoms) different from the dopant impurity species of the first conductivity type. A second polycrystalline silicon emitter region 118 is disposed above the crystalline silicon substrate 102 and is adjacent to but separated from the first polycrystalline silicon emitter region 116. The second polycrystalline silicon emitter region 118 is doped with dopant impurity species of a second, opposite, conductivity type (e.g., boron atoms). First and second conductive contact structures 122 and 124 are electrically connected to the first and second polycrystalline silicon emitter regions 116 and 118, respectively.

In another aspect, FIG. 4 schematically illustrates a cross-sectional view of an inline platform for patterned implant involving a traveling wafer and stationary shadow mask, in accordance with an embodiment of the present disclosure.

Referring to FIG. 4, an inline platform 400 includes a wafer input region for an input wafer having a layer of silicon 106. A first station 450 is configured to implant dopant impurity atoms of a first conductivity type through a first shadow mask and into first regions of a material layer 106 disposed above a substrate. A second station 452 is configured to implant ancillary impurity species through a second shadow mask and into the first regions of the material layer 106. A third station 454 is configured to implant dopant impurity atoms of a second, different, conductivity type through a third shadow mask and into second, different, regions of the material layer 106. In a particular embodiment, as exemplified by the output wafer of FIG. 4, the first station 450 is configured to implant phosphorous (or, alternatively, arsenic atoms) or ions, the third station 454 is configured to implant boron atoms or ions, and the second station 452 is configured to implant nitrogen atoms or ions (or, alternatively, carbon atoms or ions, or oxygen atoms or ions).

Referring again to FIG. 4, a stationary stencil mask 402, such as a stationary graphite mask, is held in proximity to, but not in contact with, the substrate during implantation. Although shown as one mask with three corresponding slit patterns, it is to be appreciated that an individual shadow mask will typically be used for each of the modules 450, 452 and 454. The usable distance for spacing from the receiving substrate may be determined by the degree to which the ion beam can be collimated. A typical spacing may be between 50-250 microns which is roughly the same order of thickness as a Si solar wafer substrate. However, the spacing may be as high a 1000 microns (1 mm) under conditions which minimize the angle of divergence (from vertical) below the lower edge of the shadow mask. In an embodiment, the resulting pattern of implanted regions is a one-dimensional interdigitated finger pattern.

Figure 5:
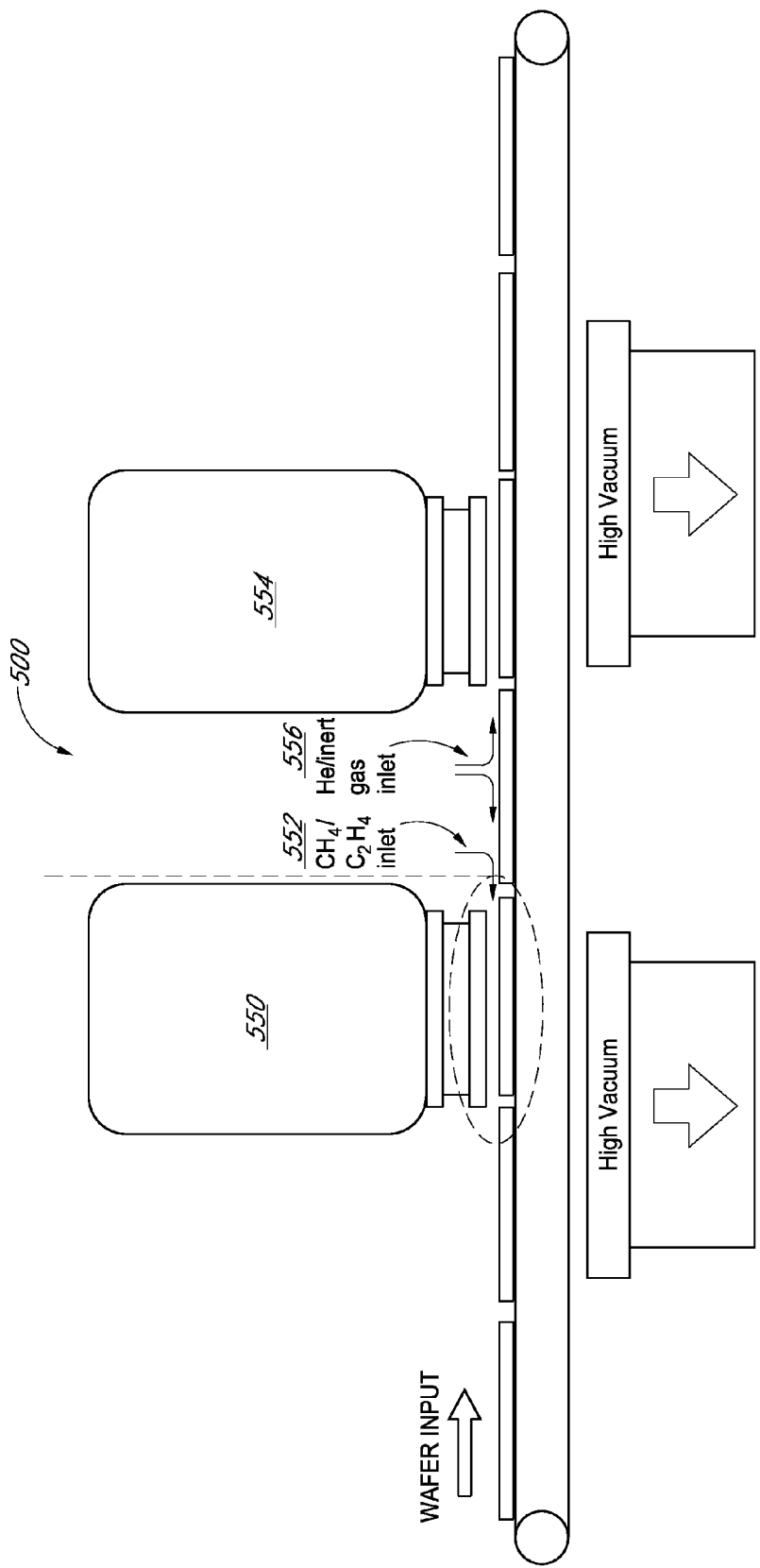
FIG. 5 schematically illustrates a cross-sectional view of another inline platform for patterned implant involving a traveling wafer and stationary shadow mask, in accordance with another embodiment of the present disclosure.

In another example, FIG. 5 schematically illustrates a cross-sectional view of another inline platform for patterned implant involving a traveling wafer and stationary shadow mask, in accordance with another embodiment of the present disclosure.

Referring to FIG. 5, an inline platform 500 includes a wafer input region for an input wafer. A first station 550 is configured to implant dopant impurity atoms of a first conductivity type (e.g., phosphorous or arsenic) through a first shadow mask and into first regions of a material layer disposed above a substrate. A second station 554 is configured to implant dopant impurity atoms of a second, different, conductivity type (e.g., boron) through a second shadow mask and into second, different, regions of the material layer. An inlet 552 is provided for cross flow introduction of C, N, or O containing precursors (for example $CH_4$ or $C_2H_4$) to provide ancillary impurity species as delivered through the space between a graphite mask and the receiving wafer. Additionally, an inert gas inlet 556 (e.g., for helium gas) may also be included to provide inert gas flow, as is depicted in FIG. 5.

Referring again to FIG. 5, like the inline apparatus of FIG. 4, a system is provided for imparting etch resistance to N-type (P) implanted fingers (relative to non-implanted areas) by surface modification through the use of ancillary impurity species. However, in contrast to the inline apparatus of FIG. 4, the same benefit or effect of the "ancillary" or chaser implant is provided without the addition of a third implant source and associated need for an additional mask alignment. In one such embodiment, a low flow of a suitable precursor (e.g., methane or ethylene) is directed into the narrow gap between the stationary graphite mask (used for the phosphorous or arsenic implant) and the wafer to effect a shallow surface modification via interactions with at least some of the incident ion flux.

Figure 6:
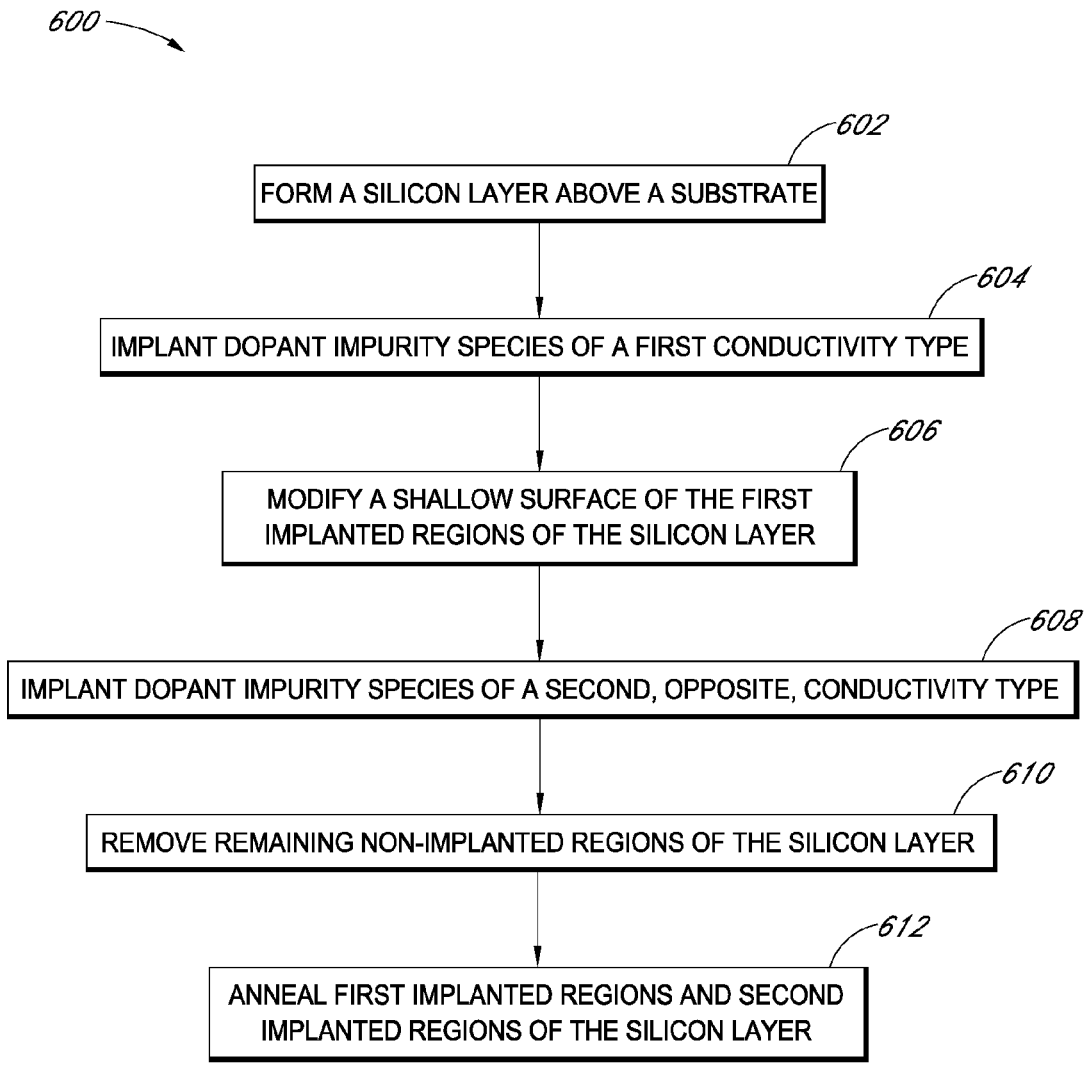
FIG. 6 is a flowchart listing operations in a method of fabricating a solar cell as corresponding to the inline platform of FIG. 5, in accordance with another embodiment of the present disclosure.

FIG. 6 is a flowchart 600 listing operations in a method of fabricating a solar cell as corresponding to the inline platform of FIG. 5, in accordance with another embodiment of the present disclosure.

Referring to operation 602 of flowchart 600, a method of fabricating alternating N-type and P-type emitter regions of a solar cell involves forming a silicon layer above a substrate. At operation 604, dopant impurity species of a first conductivity type are implanted in the silicon layer to form first implanted regions, resulting in non-implanted regions of the silicon layer. At operation 606, a shallow surface of the first implanted regions of the silicon layer is modified. The modifying is performed by flowing a precursor for an ancillary impurity species different from the dopant impurity species of the first conductivity type. In one such embodiment, flowing the precursor for the ancillary impurity species involves cross-flow introduction of methane ($CH_4$) or ethylene ($C_2H_4$).

Referring again to flowchart 600, at operation 608, dopant impurity species of a second, opposite, conductivity type are implanted in portions of the non-implanted regions of the silicon layer to form second implanted regions, resulting in remaining non-implanted regions of the silicon layer. At operation 610, the remaining non-implanted regions of the silicon layer are removed with a selective etch process preserving at least a portion of the first implanted regions and preserving the second implanted regions of the silicon layer. At operation 610, the first implanted regions and the second implanted regions of the silicon layer are annealed to form doped polycrystalline silicon emitter regions.

In an embodiment, as described above, a stencil mask such as a stationary graphite shadow mask may be used for implantation. As an example, FIGS. 4 and 5 schematically illustrate possible inline platforms for patterned implant involving stationary shadow masks, in accordance with an embodiment of the present disclosure. In either of the above described cases, in an embodiment, some deposition or residue accumulation may occur on the stencil masks. After numerous runs, such deposition or accumulation may require removal from the masks. It is to be appreciated that an optimal number of runs may be determined to balance throughput against an over-accumulation of material on the stencil mask that could in some way impact later implantation processes. In one such embodiment, after a certain number of runs, the accumulated material is removed by selective etching, and the stencil mask can then be reused.

Figure 7A:
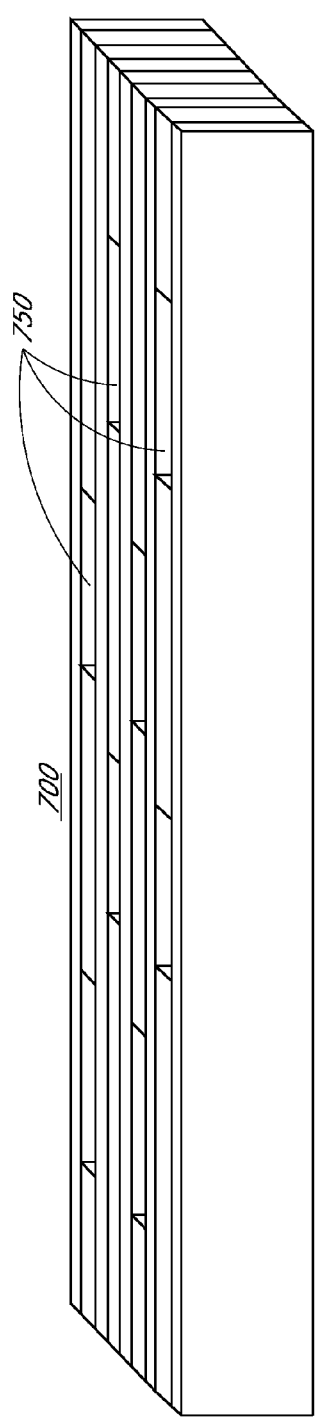
FIGS. 7A and 7B illustrate an angled view and a cross-sectional view, respectively, of a slit mask fabricated from a stack of material layers in accordance with an embodiment of the present disclosure.
Figure 7B:
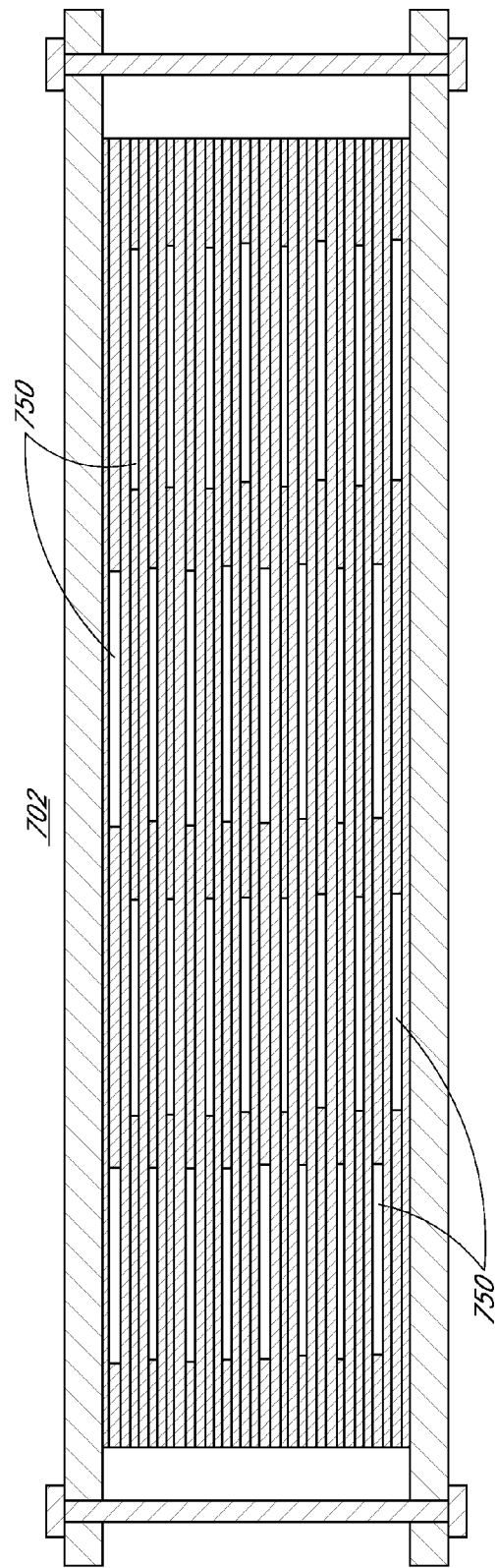

It is to be appreciated that fabrication of a slit mask may be performed by forming (e.g., cutting, etching) slits in a uniform sample of material. However, in another aspect, a slit mask is fabricated using a stack of material layers that can be cut or etched to provide a slit pattern therein. As an example, FIGS. 7A and 7B illustrate an angled view 700 and a cross-sectional view 702, respectively, of a slit mask fabricated from a stack of material layers in accordance with an embodiment of the present disclosure. Referring to FIGS. 7A and 7B, the dimensions of a slit 750 in the mask is determined by the thickness of a single layer used to fabricate the mask. In one such embodiment, the individual layers are individual silicon wafers that are stacked and bonded to one another.

Thus, the introduction of new high throughput ion implant tools targeting high efficiency solar applications with patterning capabilities may be applicable to the fabrication of interdigitated back contact (IBC) solar cells. In particular, in cases where physical and chemical changes are associated with performing ion implant operations, such implantation can be exploited to permit the formation of a self-aligned trench pattern.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In general, embodiments described herein may be implemented to provide lower cost, high throughput ion implant platforms for the fabrication of high efficiency interdigitated back contact (IBC)-type solar cells. Specific embodiments can offer an advantageous approach for generating self-aligned trenches among emitter regions formed by implantation.

Thus, methods of fabricating solar cell emitter regions using ion implantation, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating alternating N-type and P-type emitter regions of a solar cell, the method comprising:
    forming a silicon layer above a substrate;
    implanting dopant impurity species of a first conductivity type in the silicon layer to form first implanted regions and resulting in non-implanted regions of the silicon layer;
    implanting ancillary impurity species into the first implanted regions of the silicon layer, the ancillary impurity species different from the dopant impurity species of the first conductivity type;
    implanting dopant impurity species of a second, opposite, conductivity type in portions of the non-implanted regions of the silicon layer to form second implanted regions and resulting in remaining non-implanted regions of the silicon layer;
    removing the remaining non-implanted regions of the silicon layer with a selective etch process preserving at least a portion of the first implanted regions and preserving the second implanted regions of the silicon layer; and annealing the first implanted regions and the second implanted regions of the silicon layer to form doped polycrystalline silicon emitter regions.

2. The method of claim 1, wherein implanting ancillary impurity species into the first implanted regions of the silicon layer comprises forming a corresponding region of the ancillary impurity species for a respective one of the first implanted regions, the corresponding region of the ancillary impurity species entirely within the respective one of the first implanted region.

3. The method of claim 2, wherein forming the corresponding region of the ancillary impurity species for the respective one of the first implanted regions comprises forming the corresponding region of the ancillary impurity species having a width less than the width of the respective one of the first implanted regions.

4. The method of claim 3, wherein removing the remaining non-implanted regions of the silicon layer further comprises removing portions of each of the first implanted regions that do not include the corresponding region of the ancillary impurity species.

5. The method of claim 2, wherein forming the corresponding region of the ancillary impurity species for the respective one of the first implanted regions comprises forming the corresponding region of the ancillary impurity species having a depth in the silicon layer less than the depth of the respective one of the first implanted regions.

6. The method of claim 1, wherein annealing the first implanted regions and the second implanted regions of the silicon layer comprises performing the annealing subsequent to removing the remaining non-implanted regions of the silicon layer with the selective etch process.

7. The method of claim 1, wherein forming the silicon layer comprises forming an amorphous silicon layer using low pressure chemical vapor deposition (LPCVD) or plasma enhanced chemical vapor deposition (PECVD).

8. The method of claim 1, wherein implanting dopant impurity species of the first conductivity type comprises implanting phosphorous or arsenic atoms or ions, wherein implanting dopant impurity species of the second conductivity type comprises implanting boron atoms or ions, and wherein implanting ancillary impurity species into the first implanted regions comprises implanting a species selected from the group consisting of nitrogen atoms or ions, carbon atoms or ions, and oxygen atoms or ions.

9. The method of claim 8, wherein implanting phosphorous or arsenic atoms or ions comprises implanting to form a concentration of phosphorous or arsenic atoms in the silicon layer approximately in the range of 1E19-1E20 atoms/cm$^3$, wherein implanting boron atoms or ions comprises implanting to form a concentration of boron atoms in the silicon layer approximately in the range of 1E19-1E20 atoms/cm$^3$, and wherein implanting the species selected from the group consisting of nitrogen atoms or ions, carbon atoms or ions, and oxygen atoms or ions comprises implanting to form a concentration of nitrogen atoms, carbon atoms, or oxygen atoms, respectively, in the silicon layer approximately in the range of 1E19-1E21 atoms/cm$^3$.

10. The method of claim 1, wherein implanting dopant impurity species of the first conductivity type comprises implanting through a first shadow mask having a first slit pattern, wherein implanting ancillary impurity species into the first implanted regions comprises implanting through a second shadow mask having the first slit pattern, and wherein implanting dopant impurity species of the second conductivity type comprises implanting through a third shadow mask having a second, different, slit pattern.

11. The method of claim 10, wherein implanting through the second shadow mask comprises implanting through the second shadow mask having slits of a narrower dimension than slits of the first shadow mask.

12. The method of claim 10, wherein the implanting through the first, second and third shadow masks comprises implanting through first, second and third stationary graphite shadow masks, respectively, and wherein the first, second and third stationary graphite shadow masks are in close proximity to, but not in contact with, the silicon layer during the implanting.

13. The method of claim 10, wherein the first slit pattern and the second slit pattern together form a one-dimensional interdigitated finger pattern.

14. The method of claim 1, wherein removing the remaining non-implanted regions of the silicon layer with the selective etch process comprises using a hydroxide-based wet etchant, the method further comprising using the selective etch process to texturize portions of the substrate exposed upon removing the remaining non-implanted regions of the silicon layer.

15. The method of claim 1, wherein forming the silicon layer comprises forming the silicon layer on a thin oxide layer disposed on the substrate, wherein the substrate is a monocrystalline silicon substrate.

16. The method of claim 1, further comprising:
   forming conductive contacts electrically connected to the doped polycrystalline silicon emitter regions.

* * * * *